United States Patent
Blake (10) Patent No.: US 10,802,084 B2
(45) Date of Patent: Oct. 13, 2020

(54) METHODS AND SYSTEMS FOR OPEN-PHASE DETECTION IN POWER TRANSFORMERS

(71) Applicant: GENERAL ELECTRIC TECHNOLOGY GMBH, Baden (CH)

(72) Inventor: James Blake, Scottsdale, AZ (US)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 237 days.

(21) Appl. No.: 15/579,624

(22) PCT Filed: Jun. 16, 2016

(86) PCT No.: PCT/US2016/037819
§ 371 (c)(1),
(2) Date: Dec. 5, 2017

(87) PCT Pub. No.: WO2016/205479
PCT Pub. Date: Dec. 22, 2016

(65) Prior Publication Data
US 2018/0149691 A1    May 31, 2018

Related U.S. Application Data

(60) Provisional application No. 62/180,152, filed on Jun. 16, 2015, provisional application No. 62/321,407, filed on Apr. 12, 2016.

(51) Int. Cl.
*G01R 31/62* (2020.01)
*G01R 29/16* (2006.01)
(Continued)

(52) U.S. Cl.
CPC ............ *G01R 31/62* (2020.01); *G01R 29/16* (2013.01); *H02H 1/0007* (2013.01); *H02H 3/26* (2013.01); *H02H 3/34* (2013.01); *H02H 7/042* (2013.01)

(58) Field of Classification Search
None
See application file for complete search history.

(56) References Cited

U.S. PATENT DOCUMENTS

| 2006/0170410 A1* | 8/2006 | Bjorn | G01R 31/025 324/96 |
| 2007/0085549 A1* | 4/2007 | Fischer | G01R 29/16 324/521 |

(Continued)

FOREIGN PATENT DOCUMENTS

WO    2015/073510 A1    5/2015

OTHER PUBLICATIONS

Abed, N.Y., et al., "Simulation and Detection of Open Phase for Generating Station Auxiliary Three Phase Transformers," IEEE PES General Meeting, Conference & Exposition, pp. 4 (2014).

(Continued)

*Primary Examiner* — Roy Y Yi
*Assistant Examiner* — Geoffrey T Evans
(74) *Attorney, Agent, or Firm* — Eversheds Sutherland (US) LLP (57) ABSTRACT

The open-phase condition of a standby power transformer is detected by monitoring functions of the phase currents. The functions have parameters calculated based on reference currents, which constitute a "fingerprint" when all the phases are connected.

19 Claims, 9 Drawing Sheets

(51) Int. Cl.
    *H02H 3/26*     (2006.01)
    *H02H 3/34*     (2006.01)
    *H02H 7/04*     (2006.01)
    *H02H 1/00*     (2006.01)

(56) References Cited

U.S. PATENT DOCUMENTS

2009/0160454 A1    6/2009   Johansson et al.
2016/0202306 A1*  7/2016   Ha .................. G01R 31/026
                                                          324/127

OTHER PUBLICATIONS

Norouzi, A., "Open Phase Conditions in Transformers Analysis and Protection Algorithm," 66th Annual Conference for Protective Relay Engineers, pp. 1-14 (Apr. 8-11, 2013).

Rose, A.H., and Day, G.W., "Optical Fiber Current and Voltage Sensors for Electric Power Industry," in Handbook of Optical Fiber Sensing Technology Chapter 27, Wiley and Sons, pp. 569-618 (2002).

International Search Report and Written Opinion issued in connection with corresponding PCT Application No. PCT/US2016/037819 dated Sep. 6, 2016.

Blake, J., Open phase detection for power transformers using VT triggered optical CTS and IEC 61850-9.2LE compliant relays, GE Co-Pending U.S. Appl. No. 62/321,407, filed Apr. 12, 2016.

* cited by examiner

METHODS AND SYSTEMS FOR OPEN-PHASE DETECTION IN POWER TRANSFORMERS

CROSS REFERENCE TO RELATED APPLICATIONS

This application claims priority and benefit from U.S. Provisional Patent Application No. 62/180,152, filed on Jun. 16, 2015, for "Open Phase Detection of Power Transformers," and U.S. Provisional Patent Application No. 62/321,407, filed on Apr. 12, 2016, for "Open Phase Detection for Power Transformers using VT triggered Optical CTS and IEC 61850-9.2LE Compliant Relays," the entire contents of both documents are incorporated herein by reference.

BACKGROUND

Technical Field

Embodiments of the subject matter disclosed herein generally relate to detecting whether any phase on a high side of a power transformer in standby state (i.e., energized, but unloaded) has become disconnected, grounded, or impedance grounded. More specifically, an open-phase condition is detected using one or more quantities derived from the phase currents.

Discussion of the Background

In power plants (e.g., nuclear power plants), the auxiliary equipment associated with the power plant is typically powered by the power generated by the power plant itself. However, when a power failure occurs in the plant, power supplies for normal operations of the auxiliary equipment may be compromised. In order to ensure power for the auxiliary equipment (e.g., equipment that cools the nuclear reactor core to prevent a meltdown), an alternative power supply must be maintained and readily available. This alternative power supply may include a power line running from a power source remote from the power plant which is connected to a high side of a power transformer, the low side being connectable to the auxiliary equipment. During normal operations, the transformer is often in standby mode, but in the event of failure, the auxiliary equipment promptly becomes the power transformer's low side load. Thus, under normal conditions, these power transformers are unloaded and on standby, with the high side connected to the power line. Maintaining the high side connection allows the power transformers to be quickly switched on when needed.

Several incidents have been caused by power generators not being fully connected at the high side (i.e., being in an open-phase condition), a condition noted only when the emergency power was needed. In response to this problem, the Nuclear Regulatory Commission in the United States now requires that all standby power generators be monitored (i.e., have monitoring equipment installed) to detect the open-phase condition and to ensure that auxiliary power can be rapidly provided when needed. In this context art, the terms "open-phase condition (OPC)" and "open-phase detection (OPD)" as used herein refer not only to disconnected lines, but also to grounded lines.

If unloaded, current flowing into the high side of such standby power transformers is substantially the current attributable to the magnetization of the power transformer's core, and is typically less than one ampere, such as 50 to 800 mA. Alternatively, if the standby power transformer is slightly loaded (e.g., due to a monitoring load's presence), then current flowing into the high side of the standby power transformer might be a bit higher, e.g., on the order of an ampere or greater. Regardless, when in the undesirable open-phase condition (including disconnected or grounded conditions), current flowing into the high side of the standby power transformer may drop (e.g., when the current is only generated by capacitive coupling on a disconnected line or may rise (e.g., when the current is flowing through a grounded line), but in any case, the three phase currents change either in magnitude, phase, or both.

Thus, the open-phase condition has conventionally been detected by monitoring the current flowing into the high side of the transformer. However, under certain circumstances, an open-phase condition can exist without a corresponding low-phase magnetization current at the transformer. For example, when there is a break in the power line a great distance from the transformer (e.g., greater than 1 km), capacitive coupling between the three lines can energize the broken line enough so that current exists on the broken phase line at the transformer. In some cases (e.g., a power line broken approximately 5 km from the transformer), the current at the transformer for the broken line is greater than would exist without this fault condition. The same holds true for power lines which break and become grounded. Accordingly, focusing solely on whether low-phase magnetization current exists in the high side of the transformer, or whether that low-phase current has an appropriate magnitude, will sometimes fail to detect the open-phase condition.

Accordingly, it would be desirable to provide other methods and instrumentation able to detect the open-phase condition, e.g., even when capacitive coupling or grounding yields current in a broken power line.

SUMMARY

The embodiments described in this document detect the open-phase condition based on, for example, similarity of the phase currents to reference phase currents recorded when the power transformer is in standby mode with all phases connected.

According to one embodiment, there is a method for detecting an open-phase condition in a standby power transformer. The method includes measuring reference currents for the three phases connected to the power line with the low side unloaded, defining a quantity as a function of phase currents, with parameters of the function determined based on the reference currents, and monitoring values of the quantity calculated using current phase currents, to determine whether an open-phase condition has occurred.

According to another embodiment, a controller is configured to detect an open-phase condition in a standby power transformer. The controller includes at least three current-sensing elements able to sense currents on the three phases, and a signal-processing apparatus. The signal-processing apparatus is configured to receive sensing signals representing the phase currents from the at least three current-sensing elements, to process the sensing signals so as to extract information about the phase currents, to use reference currents sensed when a low side of the power transformer is unloaded and the three phases are connected to calculate parameters of functions defining at least one quantity that depends on the phase currents, and to monitor the at least one quantity to determine whether an open-phase condition has occurred.

According to yet another embodiment, there is a method for enabling open-phase detection on a standby power transformer. The method includes disposing current-sensing elements able to sense currents on the three phases, and connecting the current-sensing elements to a signal-processing apparatus. The method further includes measuring reference currents for the three phases connected to the power line, using the current-sensing elements, and calculating, by the signal-processing apparatus, parameters of functions of phase currents based on the reference currents. The method further includes monitoring values of the functions for current phase currents to determine whether the transformer has been disconnected from one of the three phases.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed with regard to the terminology and structure of power transformers configured to convert high voltage from the power line to lower voltage usable by diverse equipment.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

In order to overcome the problems of an open-phase condition being obscured by capacitive coupling currents, or ground currents, instead of conventional simple monitoring of low standby currents on each phase line various embodiments described in this section monitor the degree to which the phase currents match a "fingerprint" of a correctly phase-connected state.

Figure 1A:
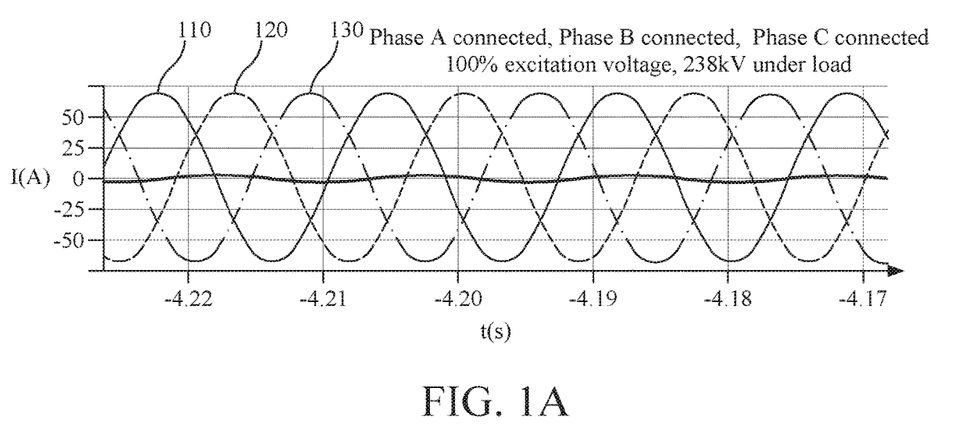
FIGS. 1A, 1B and 1C are graphical representations of phase currents when the low side is shorted.

It is well-known that the three phases of a power supply system are able to deliver currents of substantially equal magnitude, at 120° phase difference from one another. For example, FIG. 1A illustrates A, B and C phase currents (i.e., 110, 120 and 130, respectively, and also sometimes denoted I_A, I_B and I_C herein) versus time, for a loaded low side of a power transformer with all three of the phases connected. The sum of these currents, which is labeled 140, sometimes referred to as the neutral current and also sometimes denoted as I_N, is substantially equal to 0 and thus is not seen in FIG. 1A.

Figure 1B:
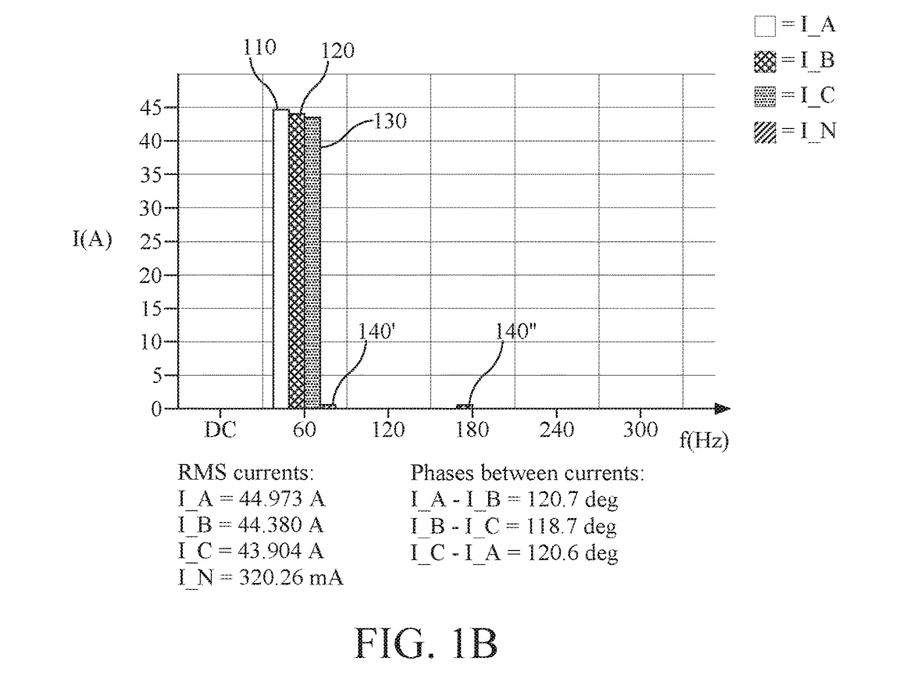

FIG. 1B illustrates the same currents in an amplitude-versus-frequency graph to show their fundamental and harmonic components. For the sake of a visible illustration, the bars representing the fundamental components of the phase currents and their sum are distributed around the 60 Hz value, which frequency actually characterizes all of them. However, the sum current, I_N, i.e., I_A+I_B+I_C, which is affected by slight deviations among the phases' hardware, has a component 140" corresponding to the 180 Hz frequency value, besides a component 140' at the 60 Hz frequency value.

Figure 1C:
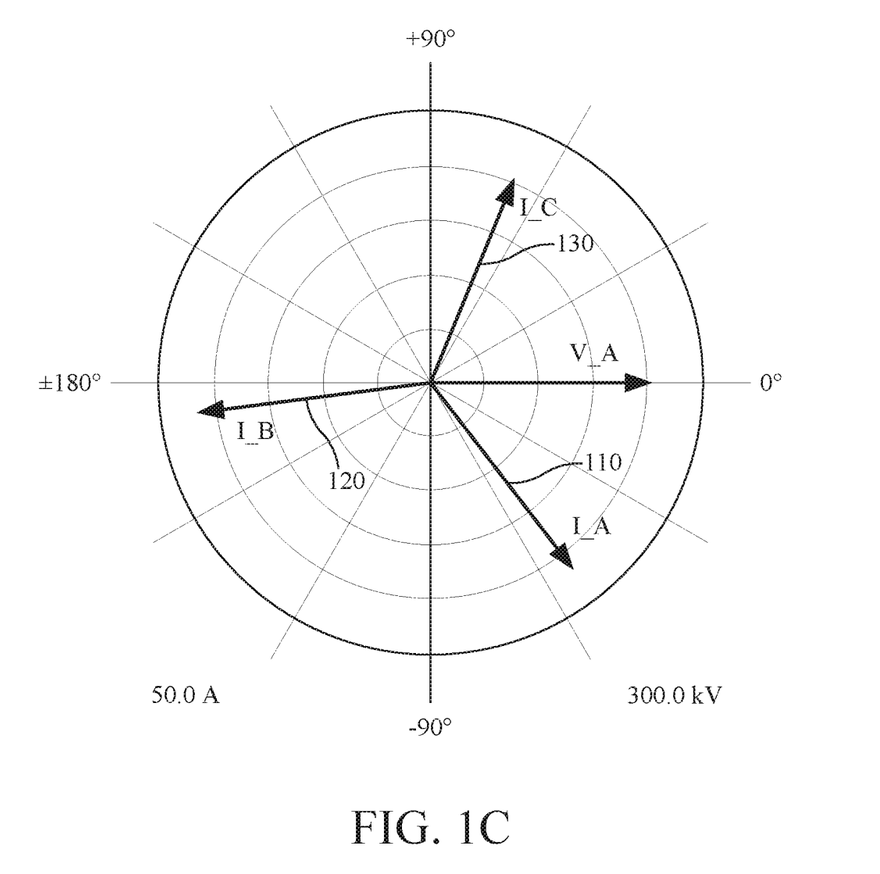

FIG. 1C illustrates the phase currents as phasors, having a magnitude equal to the currents' root-mean-square, RMS, values (in this case, I_A=44.973 A, I_B=44.380 A, and I_C=43.904 A). The phase 0° reference in FIG. 1C is phase A's potential V_A. The phase differences between the phase currents are substantially equal to 120°, that is I_A−I_B=120.7°, I_B−I_C=118.7° and I_C−I_A=120.6°. In this case, a magnitude of the sum I_N=320.26 mA is basically indistinguishable from zero in the graphical depiction of FIG. 1C.

From FIGS. 1A-1C, those skilled in the art will appreciate that with a load on the transformer secondary, the three phase currents flowing on the high side of the power transformer are: nearly equal in magnitude, nearly 120 degrees apart in phase, have a very low harmonic content and are nearly balanced yielding a small neutral current.

Figure 2:
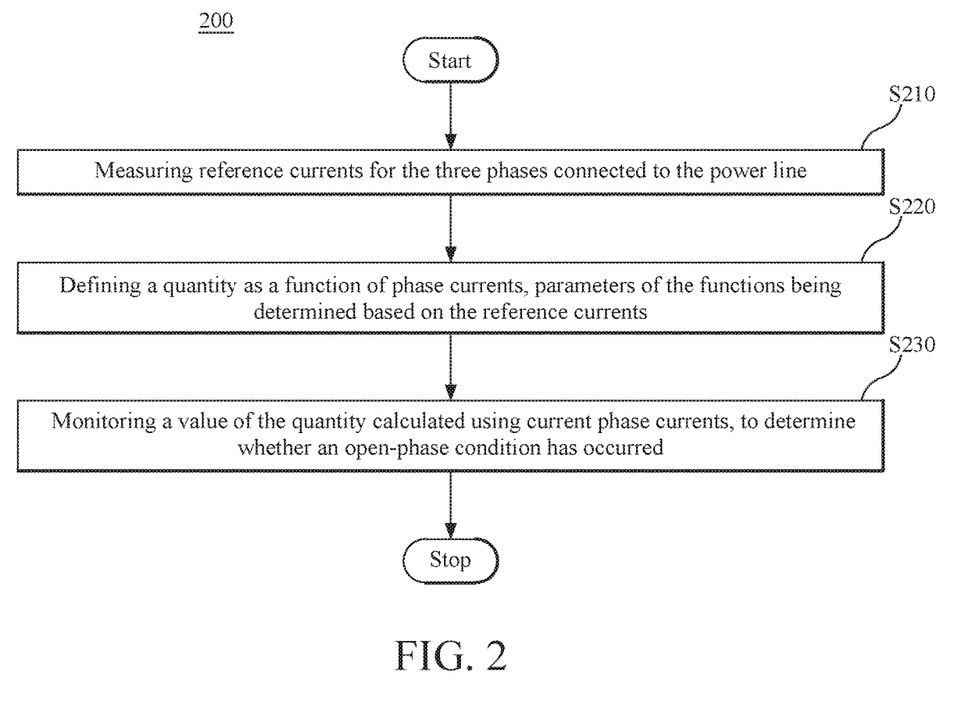
FIG. 2 is a flowchart of a method according to an embodiment.
Figure 5:
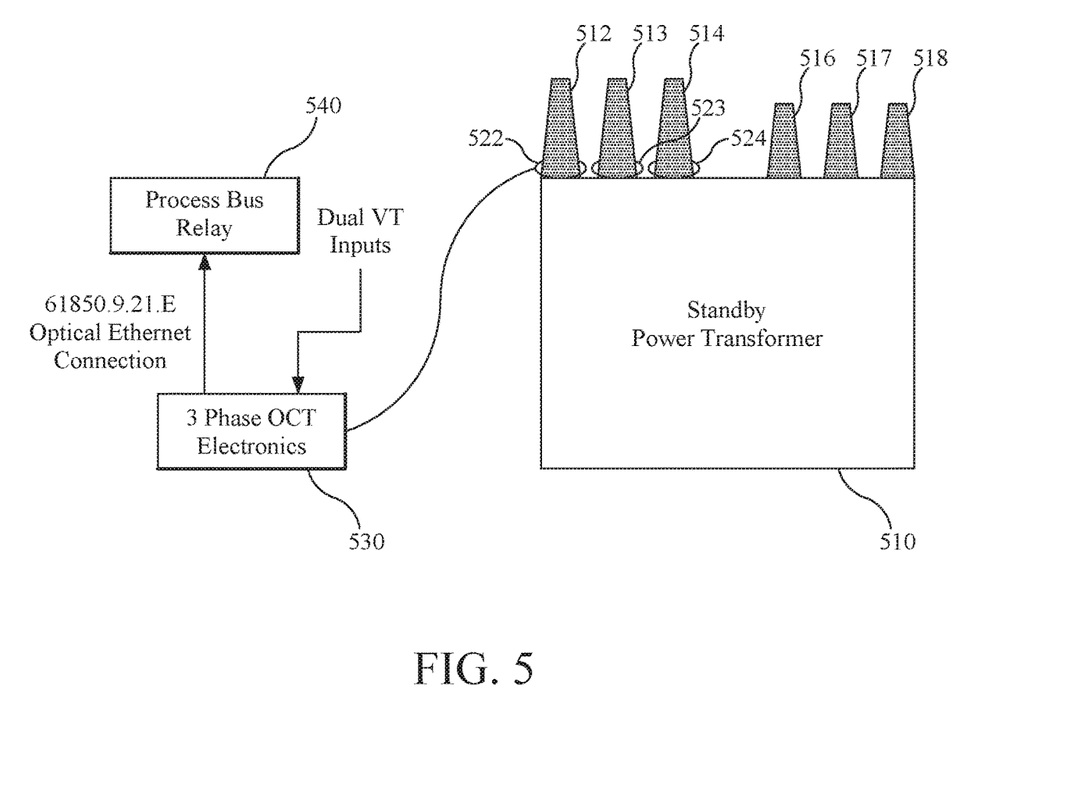
FIG. 5 is a controller according to an embodiment.

FIG. 2 is a flowchart of a method 200 for detecting an open-phase condition of a power transformer on standby, according to an embodiment. Method 200 starts by measuring reference currents for the three phases connected to the power line at S210, i.e., the three phases of the high side of the transformer as shown in FIG. 5 and discussed below, when the transformer is loaded and when it is known that there is no open circuit condition.

Figure 3A:
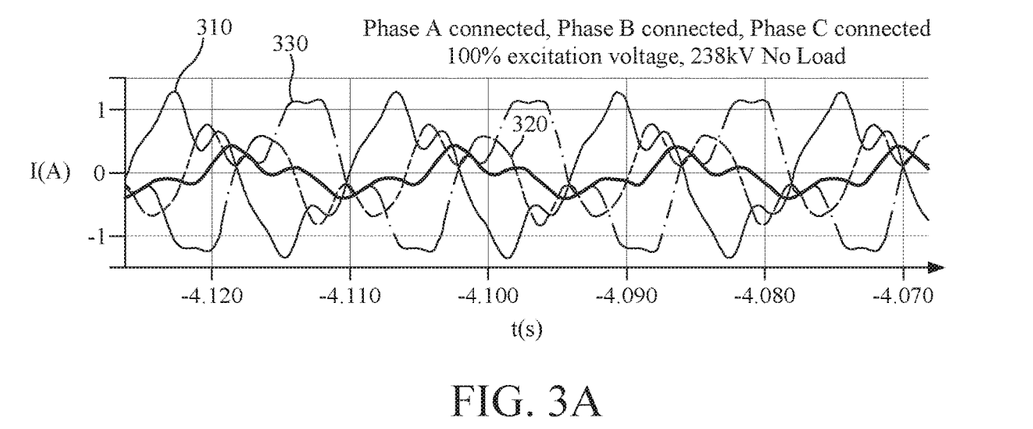
FIGS. 3A, 3B and 3C are graphical representations of phase currents when the low side is unloaded and all phases are connected.
Figure 3B:
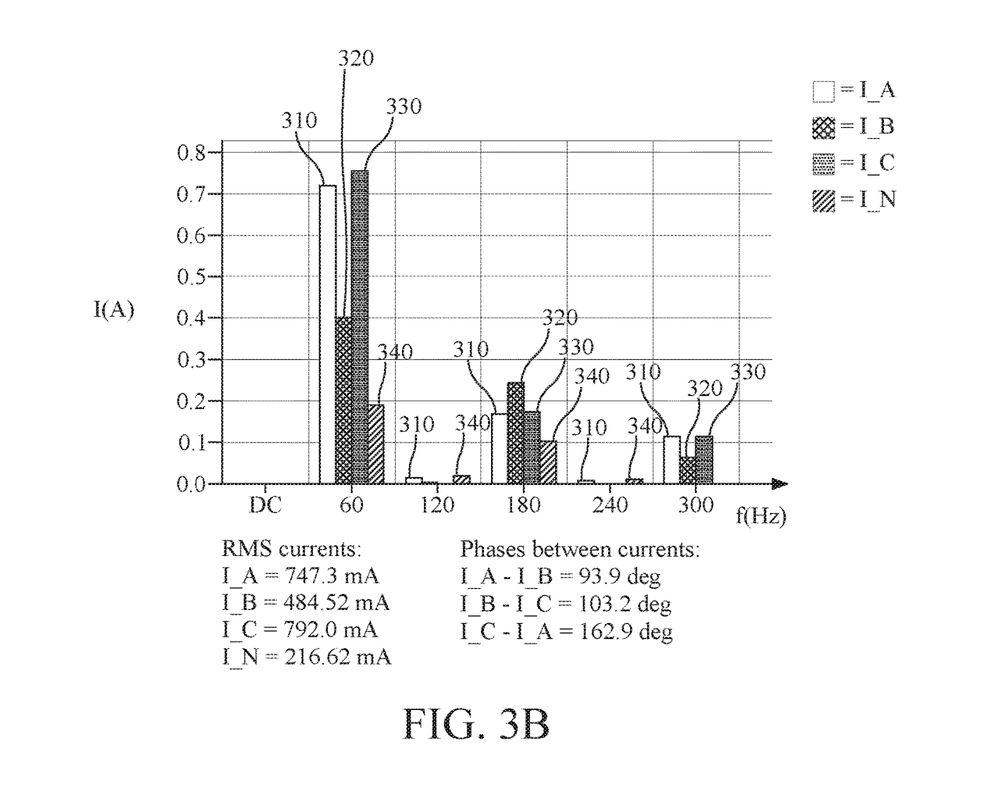
Figure 3C:
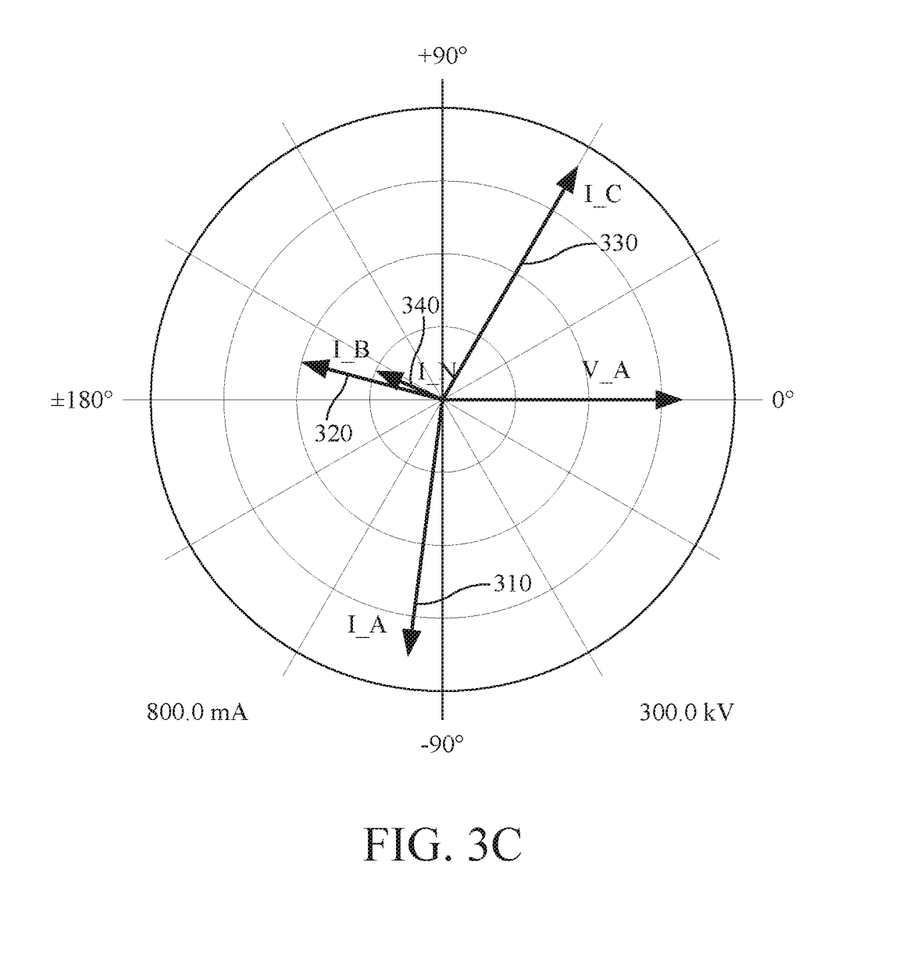

More specifically, and purely as an illustrative example of step 210, FIGS. 3A, 3B and 3C represent a measurement of the three reference currents, 310, 320 and 330, and their sum 340, in a triad of representations similar to the representations in FIGS. 1A, 1B and 1C, for the standby case where the power transformer is connected but unloaded. In standby, the phase currents are much lower (hundreds of mA) than the loaded currents (over 40 A) in FIGS. 1A, 1B and 1C. Additionally, as shown in FIG. 3B and observed from the more complex time evolution in FIG. 3A, the harmonics (at frequency multiples of 60 Hz) become more significant. FIG. 3B reveals that the phase differences between the reference currents depart significantly from 120°. Finally, in standby, the sum of the phase currents I_N (labeled 340) has a magnitude which is significant relative to the reference currents' magnitudes. Specifically, the reference currents in FIGS. 3A, 3B and 3C have the following RMS values and phase differences: I_A=747.3 mA, I_B=484.52 mA, I_C=792.0 mA, I_N=216.62 mA, I_A−I_B=93.9°, I_B−I_C=103.2°, and I_C−I_A=162.9°. From these measured reference current values, the "fingerprint" of this particular (and purely illustrative) transformer in standby without an open-phase condition can be derived. Note, for example, that without a load on the transformer secondary, the three phases exhibit: significant differences in amplitude, relative phase angles which differ significantly from 120 degrees, have relatively high harmonic content and exhibit a neutral current that is a good fraction of the phase magnetization currents.

For example, and returning now to method 200, at S220 at least one quantity is defined as a function of phase currents. That is, parameters of the functions are determined based on the reference currents, examples of which are provided below. According to an embodiment at least one quantity is used to detect the open-phase condition. For example, an excitation aerial current, $I_E$, an unexpected aerial value, $I_U$, and/or the textbook zero sequence current, $I_0$, may provide an alternative manner of carrying the information from the phase currents, $I_A$, $I_B$ and $I_C$. The excitation aerial current may be a measurement of the similarity of phase currents to the reference currents. The zero sequence current is the sum of the reference currents. According to an embodiment, the unexpected aerial current is advantageously defined so that its value is zero for the reference currents.

According to a non-limiting embodiment, the excitation aerial current, $I_E$, the unexpected aerial current, $I_U$, and the zero current, $I_0$, are calculated as:

$$\begin{pmatrix} I_0 \\ I_E \\ I_U \end{pmatrix} = \frac{1}{3} \begin{pmatrix} 1 & 1 & 1 \\ \frac{N_1(-1-2\beta)}{\alpha-\beta} & \frac{N_1(\beta-1)}{\alpha-\beta} & \frac{N_1(\beta+2)}{\alpha-\beta} \\ \frac{N_2(2\alpha+1)}{\alpha-\beta} & \frac{N_2(1-\alpha)}{\alpha-\beta} & \frac{N_2(-2-\alpha)}{\alpha-\beta} \end{pmatrix} \begin{pmatrix} I_A \\ I_B \\ I_C \end{pmatrix} \quad (1)$$

for the phase currents, $I_A$, $I_B$ and $I_C$, with $N_1$ and $N_2$ being normalization factors, $\alpha$ an arbitrary complex number, and $\beta$ calculated as $$\beta = -\frac{\alpha^* + 2}{2\alpha^* + 1},$$

(the symbol * indicating complex conjugate, and $$N_1 = \frac{1}{\sqrt{3}} \sqrt{1 + |\alpha|^2 + |\alpha+1|^2}, \text{ and } N_2 = \frac{1}{\sqrt{3}} \sqrt{1 + |\beta|^2 + |\beta+1|^2}.$$

Here, $\alpha$ may be calculated so that the unexpected aerial current is zero for the reference currents. Thus $\alpha$ is calculated as:

$$\alpha = \frac{I_{AR} + I_{BR} - 2I_{CR}}{-2I_{AR} + I_{BR} + I_{CR}} \quad (2)$$

wherein $I_{AR}$, $I_{BR}$ and $I_{CR}$ are the reference currents.

Formula (1) being written in vector form is easily converted into algebraic form, (e.g., $I_0 = 1/3(I_A + I_B + I_C)$, etc.), and may be inverted to express the phase currents as functions of the excitation aerial current, $I_E$, the unexpected aerial current, $I_U$, and the zero current, $I_0$:

$$\begin{pmatrix} I_A \\ I_B \\ I_C \end{pmatrix} = \begin{pmatrix} 1 & 1/N_1 & 1/N_2 \\ 1 & -(\alpha+1)/N_1 & -(\beta+1)/N_2 \\ 1 & \alpha/N_1 & \beta/N_2 \end{pmatrix} \begin{pmatrix} I_0 \\ I_E \\ I_U \end{pmatrix}. \quad (3)$$

Finally, at S220 of method 200, values of the one or more quantities calculated using current phase current values are monitored to determine whether an open-phase condition has occurred. For example, FIGS. 4A, 4B and 4C (the same triad of representations as FIGS. 1A, 1B and 1C or FIGS. 3A, 3B, and 3C) illustrate phase currents, 410, 420 and 430, and their sum, measured while phase C is open. In this case, the RMS values and phase differences between the phase currents are as follows: I_A=1.4124 A, I_B=985.6 mA, I_C=81.74 mA, I_N=2.1633 A, I_A−I_B=43.4° and I_B−I_C and I_C−I_A cannot be determined.

Figure 4A:
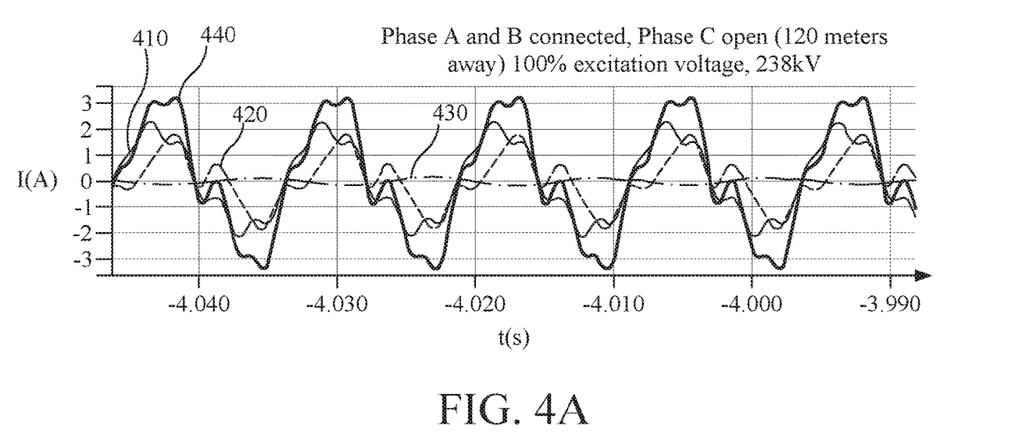
FIGS. 4A, 4B and 4C are graphical representations of phase currents when the low side is unloaded and one of the phases is open.
Figure 4B:
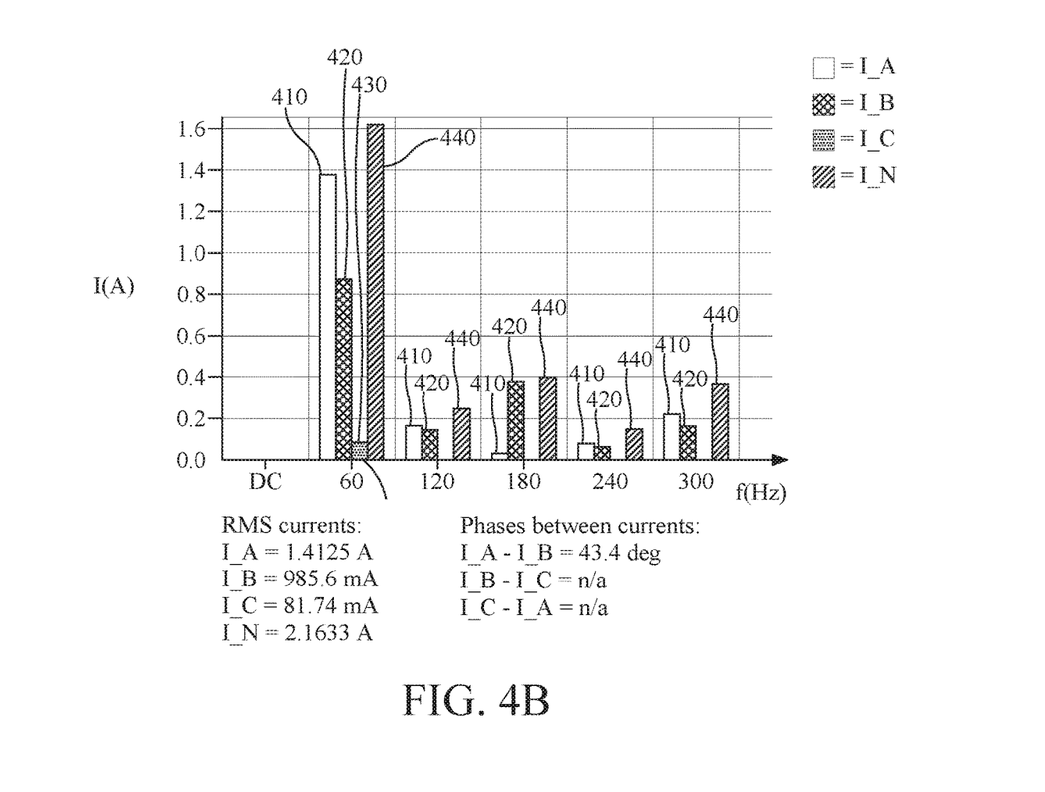
Figure 4C:
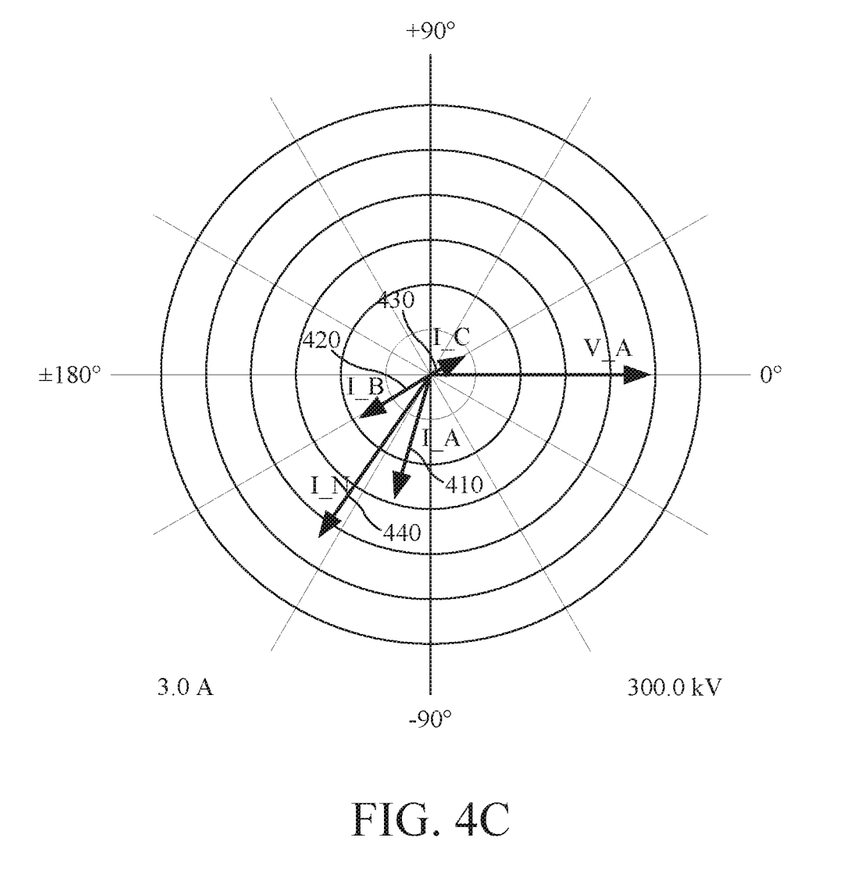

The RMS value(s) of the one or more quantities described above can be monitored, e.g., computed based on the measurements taken as reflected by FIGS. 4A-4C, to determine if one of the values exceeds a pre-defined threshold for a predetermined length of time. The threshold levels to be exceeded and the length of time required to declare an open phase condition depends on each transformer and its particular situation within the larger power system. For example, the open-phase condition may be identified when the ratio of the unexpected aerial current and the excitation aerial current ($I_U/I_E$) increases to exceed a predetermined threshold. Alternatively or additionally, the open-phase condition may be identified when the ratio of the zero current and the excitation aerial current ($I_0/I_E$) increases to exceed a predetermined threshold (the predetermined thresholds are different, depending on the ratio with which they are compared). An exemplary threshold for IU/IE is 0.3 to 0.5, and exemplary threshold for I0/IE is 0.5 to 1.0, and an exemplary time that the threshold(s) need to be exceeded to trigger an alarm is 3-60 seconds.

In one embodiment, the phase currents' values may be considered in addition to the ratio(s). Thus, the open-phase condition may also be identified when any of the phase currents becomes lower than a predetermined low threshold, or higher than a predetermined high threshold, and the first ratio or the second ratio exceeds a complementary first ratio threshold or a complementary second ratio threshold, respectively. The "complementary" label used here indicates that these thresholds may be different from the thresholds used when the ratios are considered individually.

The method may further include issuing an alarm signaling that the open-phase condition has been identified. As previously mentioned, the power transformer is in standby, ready to be connected to critical equipment if necessary. The alarm would prompt operators to repair the open phase before the need to connect critical equipment occurs.

Various tests have shown that in an open-phase condition, the ratios $I_U/I_E$ and $I_0/I_E$ may increase by over 30-50% relative to their baseline or reference values, depending upon the type of transformer being monitored, e.g., wye or delta high side, core or shell form construction. However the setting of the thresholds also depends upon the desired balance for a particular implementation between security and dependability. The higher that the thresholds are set, the more secure the system is against false trips, but the less dependable the system is for tripping in the case of a real open phase.

The open phase detection methods described in this section have been implemented in a controller (i.e., open-phase detection system) described below and schematically illustrated in FIG. 5. Power transformer 510 has high-side terminals 512, 513 and 514 connected to power line phases, while the low-side terminals 516, 517 and 518 are unloaded. Optical current transformers (OCTs) 522, 523 and 524 of fiber construction (as described, for example, in Chapter 27, entitled, "Optical Fiber Current and Voltage Sensors for Electric Power Industry," of the *Handbook of Optical Fiber Sensing Technology*, pp. 569-618, published by Wiley and Sons in 2002) are disposed to measure the phase currents. OCTs have measurement advantages over conventional iron core current transformers, which include a dynamic range orders of magnitude wider, no saturation, and much larger frequency response, including direct (continuous) current. Because of the wide dynamic range of the OCT, the same sensor can be used to detect both the magnetizing currents flowing into an unloaded power transformer as well as the currents flowing into it when it is loaded, including fault currents. Although the embodiment in FIG. 5 uses OCTs, OCT use is not compulsory, being a designer choice and not a limitation, and the embodiments described herein can be implemented using, for example, non-optical current sensing techniques.

Current detection signals from the OCTs are processed by electronics block 530 and logic processing block 540. In a multi-stream digital signal processing, electronics block 530 filters and combines the signals to yield information used by logic processing block 540 to determine whether the open-phase condition has occurred. As previously mentioned, the "fingerprint" (i.e., reference values) of currents is used to frame the open-phase detection decision.

Electronics block 530 may be configured to filter the current detection signals received while the power transformer is on standby (i.e., the low side is unloaded). As described in WO 2015/073510 (the content of which is incorporated herein by reference), the standby current detection signals may be filtered using a comb filter. Further, electronics block 530 may be programmed to calculate the parameters based on reference currents. These parameters are then used to calculate one or more quantities which are a function of phase currents, with the functions using these parameters calculated based on the reference currents. For example, these quantities may include the excitation aerial current, $I_E$, the unexpected aerial current, $I_U$, the zero current, $I_0$, the ratio $I_U/I_E$ and/or the ratio $I_0/I_E$.

Electronics block 530 then transmits these quantities to logic processing block 540, which is configured to compare these quantities with thresholds to identify that the open-phase condition has occurred based on the comparison result(s), individually or in combinations. In one embodiment, electronics block 530 also provides the filtered phase currents values to logic processing block 540, enabling comparison of these currents with respective thresholds.

As previously mentioned, OCTs may also be used to detect the higher currents when the low side is loaded. In this case, electronics block 530 may lightly filter the signals using different filters than for the low currents when the power transformer is on standby. A prototype using an IEC 61850-9.2LE process bus relay as logic processing block 540 has recently been tested. A three-phase OCT electronics block was configured to feed 12 quantities to the relay via a 61850-9.2LE optical Ethernet connection. The 12 quantities included phase currents, and quantities derived based on the phase currents (i.e., functions of the phase currents).

Figure 6:
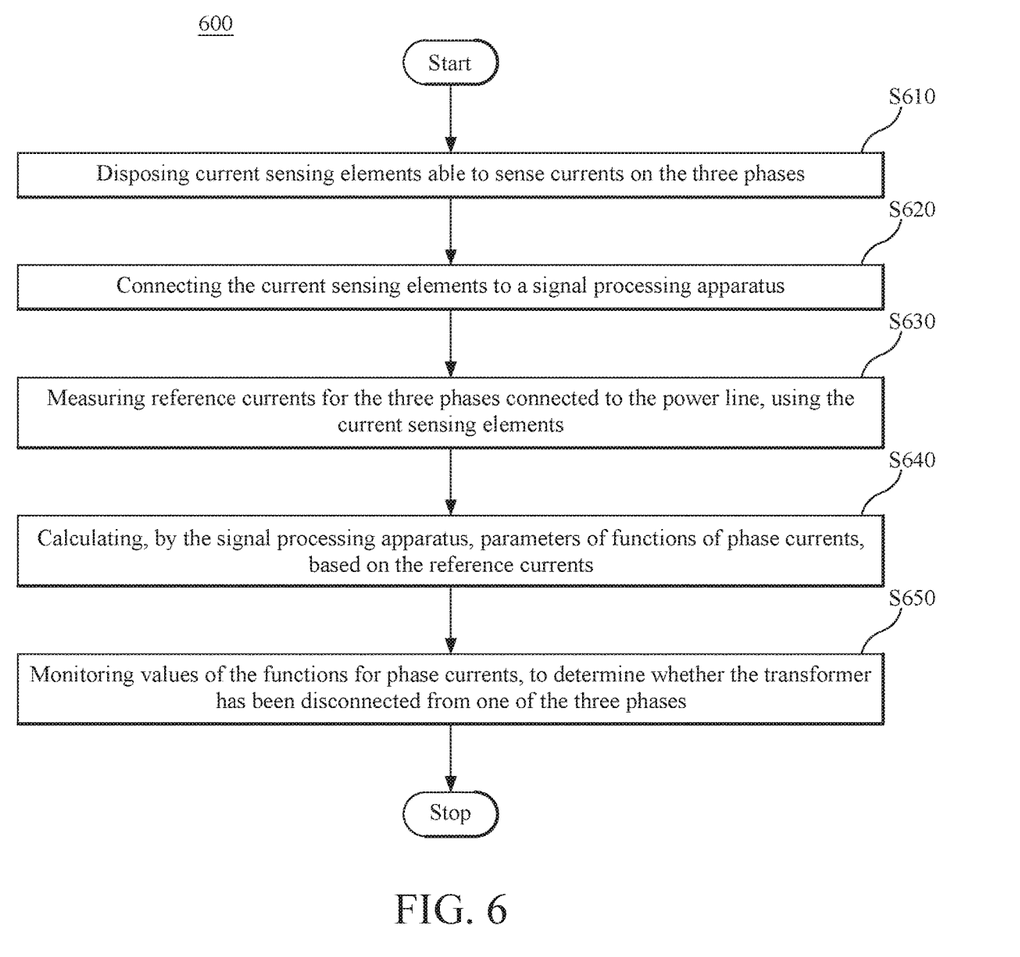
FIG. 6 is a flowchart of a method for setting up hardware able to detect an open-phase condition in a standby power transformer according to an embodiment.

Hardware able to detect a standby power transformer's open-phase condition may be added to existing power plants. FIG. 6 is a flowchart of a method 600 for setting up hardware able to detect an open-phase condition of a power transformer connected to three phases of a power line on a high-voltage side and unloaded on the low side, according to an embodiment. Method 600 includes disposing current sensing elements able to sense currents, e.g., as low as 1 mA, on the three phases at S610, and connecting the current sensing elements to a signal-processing apparatus at S620. Steps S610 and S620 set forth an equipment-mounting phase.

Method 600 further includes measuring reference currents for the three phases connected to the power line, using the current-sensing elements at S630 and calculating, by the signal-processing apparatus, parameters of functions of phase currents, based on the reference currents at S640. Steps S630 and S640 constitute a calibration phase.

Finally, in step S650 of method 600, values of the functions for current phase currents are monitored to determine whether the transformer has been disconnected from one of the three phases.

The disclosed exemplary embodiments provide methods and controllers for detecting an open-phase condition in standby power transformers. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for detecting an open-phase condition of a power transformer connected to three phases of a power line on a high voltage side, and unloaded on a low side, the method comprising:
    measuring reference currents for the three phases connected to the power line;
    defining a quantity as a function of the phase currents, with parameters of the function determined based on the reference currents; and
    monitoring a value of the quantity calculated using phase currents, to determine whether an open-phase condition has occurred,
    wherein the quantity includes at least one of: a ratio of an unexpected aerial current and an excitation aerial current, and a ratio of a zero sequence current and an expected aerial current,
    wherein the excitation aerial current comprises a measurement of a similarity of the phase currents to the reference currents, and
    wherein the zero sequence current is a sum of the reference currents.

2. The method of claim 1, wherein the excitation aerial current, $I_E$, the unexpected aerial current, $I_U$, and/or the zero sequence current, $I_0$, are calculated as $$\begin{pmatrix} I_0 \\ I_E \\ I_U \end{pmatrix} = \frac{1}{3} \begin{pmatrix} 1 & 1 & 1 \\ \dfrac{N_1(-1-2\beta)}{\alpha-\beta} & \dfrac{N_1(\beta-1)}{\alpha-\beta} & \dfrac{N_1(\beta+2)}{\alpha-\beta} \\ \dfrac{N_2(2\alpha+1)}{\alpha-\beta} & \dfrac{N_2(1-\alpha)}{\alpha-\beta} & \dfrac{N_2(-2-\alpha)}{\alpha-\beta} \end{pmatrix} \begin{pmatrix} I_A \\ I_B \\ I_C \end{pmatrix}$$

for the current phase currents, $I_A$, $I_B$ and $I_C$, $N_1$ and $N_2$ normalization factors, $\alpha$ an arbitrary complex number and $\beta$ calculated as $$\beta = -\frac{\alpha^* + 2}{2\alpha^* + 1},\ N_1 = \frac{1}{\sqrt{3}}\sqrt{1 + |\alpha|^2 + |\alpha+1|^2},$$

$$\text{and } N_2 = \frac{1}{\sqrt{3}}\sqrt{1 + |\beta|^2 + |\beta+1|^2}.$$

3. The method of claim 2, wherein $\alpha$ is calculated so that the unexpected aerial current is zero for the reference currents.

4. The method of claim 2, wherein $\alpha$ is calculated as $$\alpha = \frac{I_{AR} + I_{BR} - 2I_{CR}}{-2I_{AR} + I_{BR} + I_{CR}}$$

wherein $I_{AR}$, $I_{BR}$ and $I_{CR}$ are the reference currents.

5. The method of claim 1, wherein the quantity exceeds a predetermined threshold value.

6. The method of claim 1, further comprising:
identifying, based on a determination that a first ratio of the unexpected aerial current and the excitation aerial current increases to exceed a predetermined first ratio threshold or a determination that a second ratio of the zero sequence current and the excitation aerial current increases to exceed a predetermined second ratio threshold, the open-phase condition.

7. The method of claim 1, further comprising:
identifying, based on the phase currents becoming lower than a predetermined low threshold or the phase current becoming higher than a predetermined high threshold, and the first ratio or the second ratio exceeds a complementary first ratio threshold or a complementary second ratio threshold, respectively, the open-phase condition.

8. The method of claim 1, further comprising:
identifying the open-phase condition; and
issuing, based on identifying the open-phase condition, an alarm.

9. The method of claim 1, wherein the low side of the power transformer is connected to supply power to equipment when needed.

10. A controller configured to detect an open-phase condition for a power transformer connected to three phases of a power line on a high voltage side and unloaded on a low side, the controller comprising:
at least three current-sensing elements able to sense currents on the three phases; and
a signal-processing apparatus configured:
to receive sensing signals representing phase currents from the at least three current sensing elements,
to process the sensing signals so as to extract information about the phase currents,
to use reference currents sensed when a low side of the power transformer is unloaded and the three phases are connected, to calculate parameters of functions defining at least one quantity that depends on the phase currents, and
to monitor the at least one quantity, to determine whether an open-phase condition has occurred,
wherein the quantity includes at least one of: a ratio of an unexpected aerial current and an excitation aerial current, and a ratio of a zero sequence current and an expected aerial current,
wherein the excitation aerial current comprises a measurement of a similarity of the phase currents to the reference currents, and
wherein the zero sequence current is a sum of the reference currents.

11. The controller of claim 10, wherein the at least one quantity include one or more of: an excitation aerial current, $I_E$, an unexpected aerial current, $I_U$, and/or a zero sequence current, $I_0$, calculated as $$\begin{pmatrix} I_0 \\ I_E \\ I_U \end{pmatrix} = \frac{1}{3} \begin{pmatrix} 1 & 1 & 1 \\ \dfrac{N_1(-1-2\beta)}{\alpha-\beta} & \dfrac{N_1(\beta-1)}{\alpha-\beta} & \dfrac{N_1(\beta+2)}{\alpha-\beta} \\ \dfrac{N_2(2\alpha+1)}{\alpha-\beta} & \dfrac{N_2(1-\alpha)}{\alpha-\beta} & \dfrac{N_2(-2-\alpha)}{\alpha-\beta} \end{pmatrix} \begin{pmatrix} I_A \\ I_B \\ I_C \end{pmatrix}$$

for the current phase currents, $I_A$, $I_B$ and $I_C$, $N_1$ and $N_2$ normalization factors, $\alpha$ an arbitrary complex number and $\beta$ calculated as $$\beta = -\frac{\alpha^* + 2}{2\alpha^* + 1},\ N_1 = \frac{1}{\sqrt{3}}\sqrt{1 + |\alpha|^2 + |\alpha+1|^2},$$

$$\text{and } N_2 = \frac{1}{\sqrt{3}}\sqrt{1 + |\beta|^2 + |\beta+1|^2}.$$

12. The controller of claim 11, wherein the signal processing apparatus calculates $\alpha$ so that the unexpected aerial current is zero for the reference currents.

13. The controller of claim 11, wherein the signal processing apparatus is configured to issue an alarm upon detecting the open-phase condition.

14. The controller of claim 10, wherein the signal processing apparatus is further configured to:
identify, based on a determination that a first ratio of the unexpected aerial current and the excitation aerial current increases to exceed a predetermined first ratio threshold or a determination that a second ratio of the zero sequence current and the excitation aerial current increases to exceed a predetermined second ratio threshold, the open-phase condition.

15. The controller of claim 10, wherein the signal processing apparatus comprises:
a filtering section configured to filter the sensing signals; and
a calculation section configured to calculate the parameters of the functions based on the reference currents, and values of the at least one quantity based on the phase currents, and to determine whether the open-phase condition has occurred based on the values of the at least one quantity.

16. The controller of claim 10, wherein the at least three current sensing elements are optical current transformers.

17. A method for enabling an open-phase detection for a power transformer connected to three phases of a power line on a high voltage side and unloaded of the low side, the method comprising:

disposing current sensing elements able to sense currents on the three phases; connecting the current sensing elements to a signal processing apparatus;

measuring reference currents for the three phases connected to the power line, using the current sensing elements;

calculating, by the signal processing apparatus, parameters of functions of phase currents, based on the reference currents; and monitoring values of the functions for current phase currents, to determine whether the transformer has been disconnected from one of the three phases wherein the values of the functions includes at least one of: a ratio of an unexpected aerial current and an excitation aerial current, and a ratio of a zero sequence current and an expected aerial current, wherein the excitation aerial current comprises a measurement of a similarity of the phase currents to the reference currents, and wherein the zero sequence current is a sum of the reference currents.

18. The method of claim 17, wherein the functions include one or more of $I_E$, $I_U$ and $I_0$ to given by $$\begin{pmatrix} I_0 \\ I_E \\ I_U \end{pmatrix} = \frac{1}{3} \begin{pmatrix} 1 & 1 & 1 \\ \frac{N_1(-1-2\beta)}{\alpha-\beta} & \frac{N_1(\beta-1)}{\alpha-\beta} & \frac{N_1(\beta+2)}{\alpha-\beta} \\ \frac{N_2(2\alpha+1)}{\alpha-\beta} & \frac{N_2(1-\alpha)}{\alpha-\beta} & \frac{N_2(-2-\alpha)}{\alpha-\beta} \end{pmatrix} \begin{pmatrix} I_A \\ I_B \\ I_C \end{pmatrix}$$

for the current phase currents, $I_A$, $I_B$ and $I_C$, $N_1$ and $N_2$ normalization factors, $\alpha$ calculated as $$\alpha = \frac{I_{AR} + I_{BR} - 2I_{CR}}{-2I_{AR} + I_{BR} + I_{CR}}$$

wherein $I_{AR}$, $I_{BR}$ and $I_{CR}$ are the reference currents, $$\beta = -\frac{\alpha^* + 2}{2\alpha^* + 1}, N_1 = \frac{1}{\sqrt{3}}\sqrt{1 + |\alpha|^2 + |\alpha+1|^2},$$

$$\text{and } N_2 = \frac{1}{\sqrt{3}}\sqrt{1 + |\beta|^2 + |\beta+1|^2}.$$

19. The method of claim 17, wherein the open-phase condition is identified when $I_U/I_E$ increases to exceed a predetermined first ratio threshold, and/or when $I_0/I_E$ increases to exceed a predetermined second ratio threshold.

* * * * *